US006843659B2

(12) United States Patent
Liao et al.

(10) Patent No.: US 6,843,659 B2
(45) Date of Patent: Jan. 18, 2005

(54) ELECTRICAL CONNECTOR HAVING TERMINALS WITH REINFORCED INTERFERENCE PORTIONS

(75) Inventors: Fang-Jwu Liao, Tu-Chen (TW); Ming-Lun Szu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/459,206

(22) Filed: Jun. 10, 2003

(65) Prior Publication Data

US 2004/0102062 A1 May 27, 2004

(30) Foreign Application Priority Data

Nov. 22, 2002 (TW) .................................... 91218817 U

(51) Int. Cl.[7] ............................................ H01R 12/22
(52) U.S. Cl. ..................................................... 439/66
(58) Field of Search ............................ 439/66, 65, 71, 439/591

(56) References Cited

U.S. PATENT DOCUMENTS 5,653,598 A 8/1997 Grabbe ........................ 439/66
6,176,707 B1 1/2001 Neidich et al. ............... 439/66
6,186,797 B1 * 2/2001 Wang et al. .................. 439/66
6,296,495 B1 * 10/2001 Wang et al. .................. 439/71
6,488,513 B1 * 12/2002 Neidich et al. ............... 439/66

* cited by examiner

*Primary Examiner*—Renee Luebke
(74) *Attorney, Agent, or Firm*—Wei Te Chung

(57) ABSTRACT

An LGA electrical connector (3) includes a housing (2) defining a plurality of passageways (20) therein, and a plurality of terminals (1) received the corresponding passageways. Each passageway comprises a narrow first passage (201) and a broad second passage (202). The first passage has two stepped sidewalls each with a first sidewall (2010) and a second sidewall (2012). A space between the opposite first sidewalls is greater than that between the opposite second sidewalls. Each terminal comprises two retention portions (15). Each retention portion itself is separated, and forms a broad first interference portion (150) and a narrow second interference portion (152). The first interference portion of the terminal interferentially engages with the first sidewall of the passageway. The second interference portion of the terminal interferentially engages with the second sidewall of the passageway. Thus, the terminal can be securely received in the passageway of the housing.

13 Claims, 5 Drawing Sheets

1
10
101
14
150
15
152
12
121

101
40
4
202
10
201
50
12
121
5

ELECTRICAL CONNECTOR HAVING TERMINALS WITH REINFORCED INTERFERENCE PORTIONS

BACKGROUND OF THE INVENTION

1. Field of the Invention

The present invention relates to an electrical connector for electrically connecting an electronic package such as a land grid array (LGA) chip with a circuit substrate such as a printed circuit board (PCB), and particularly to an electrical connector with terminals each having a plurality of interference blocks.

2. Description of the Prior Art

Land grid array (LGA) connectors are widely used in personal computer (PC) systems to electrically connect LGA chips with PCBs. An LGA connector comprises a multiplicity of terminals arranged in a housing in a rectangular array. Each terminal has a first contact portion soldered to a PCB, and a second contact portion depressed by and engaging with a corresponding contact pad of an LGA chip. Thus the LGA chip and the PCB are electrically connected by the connector.

U.S. Pat. Nos. 5,653,598 and 6,176,707 and Taiwan Pat. No. 501318 each disclose a conventional LGA electrical connector. Referring to FIG. 7, U.S. Pat. No. 6,176,707 discloses a conventional terminal 6 of an LGA electrical connector. The terminal 6 is stamped from a resilient metal strip, and comprises a connection portion 60 with a pair of opposite interference blocks 62. The two interference blocks 62 protrude from opposite sides of the connection 60 respectively, for interferentially fixing the terminal 6 in a corresponding passageway of a housing of the LGA connector (not shown). A convex first top spring arm 64 extends upwardly and forwardly from the connection portion 60. An opposite convex second bottom spring arm 66 extends downwardly and forwardly from the connection portion 60. The first spring arm 64 has a curved top first contact portion 640 for engaging with a plate-like contact pad of an LGA chip (not shown) when the LGA chip is pressed against the LGA connector. The second spring arm 66 has a curved bottom second contact portion 660 for soldering to a PCB (not shown). Thus the terminal 6 electrically connects the LGA chip and the PCB.

However, a junction of each interference block 62 and the connection portion 60 is relatively small compared with a width of the interference block 62. Thus the interference blocks 62 are liable to deform when the terminal 6 is engaged in the corresponding passageway of the housing, and in subsequent use of the LGA electrical connector. When this happens, interferential force between the terminal 6 and the housing in the passageway is reduced, resulting in the terminal 6 not being securely fastened in the passageway. This can lead to disruption or failure of electrical connection between the LGA chip and PCB.

A new LGA electrical connector which overcomes the above-mentioned problems is desired.

SUMMARY OF THE INVENTION

An object of the present invention is to provide an electrical connector having terminals securely fixed in a housing thereof.

In order to achieve the above object, an electrical connector in accordance with the present invention comprises an insulative housing and a plurality of terminals. The housing defines a plurality of passageways receiving the terminals therein. Each passageway comprises a narrow first passage and a broad second passage in communication with one end of the first passage. The first passage has two stepped interior sidewalls each with a first sidewall and a second sidewall. A space between the opposite first sidewalls is greater than that between the opposite second sidewalls. Each terminal comprises a pair of retention portions. Each retention portion itself is separated thereby forming a first interference portion and a second interference portion. The first interference portion is wider than the second interference portion in an axis parallel to a top face of the retention portion. The first interference portion of the retention portion interferentially engages with the first sidewall of the passageway. The second interference portion of the protrusions interferentially engages with the second sidewall of the passageway. Thus, the terminal can be securely received in the passageway of the housing.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
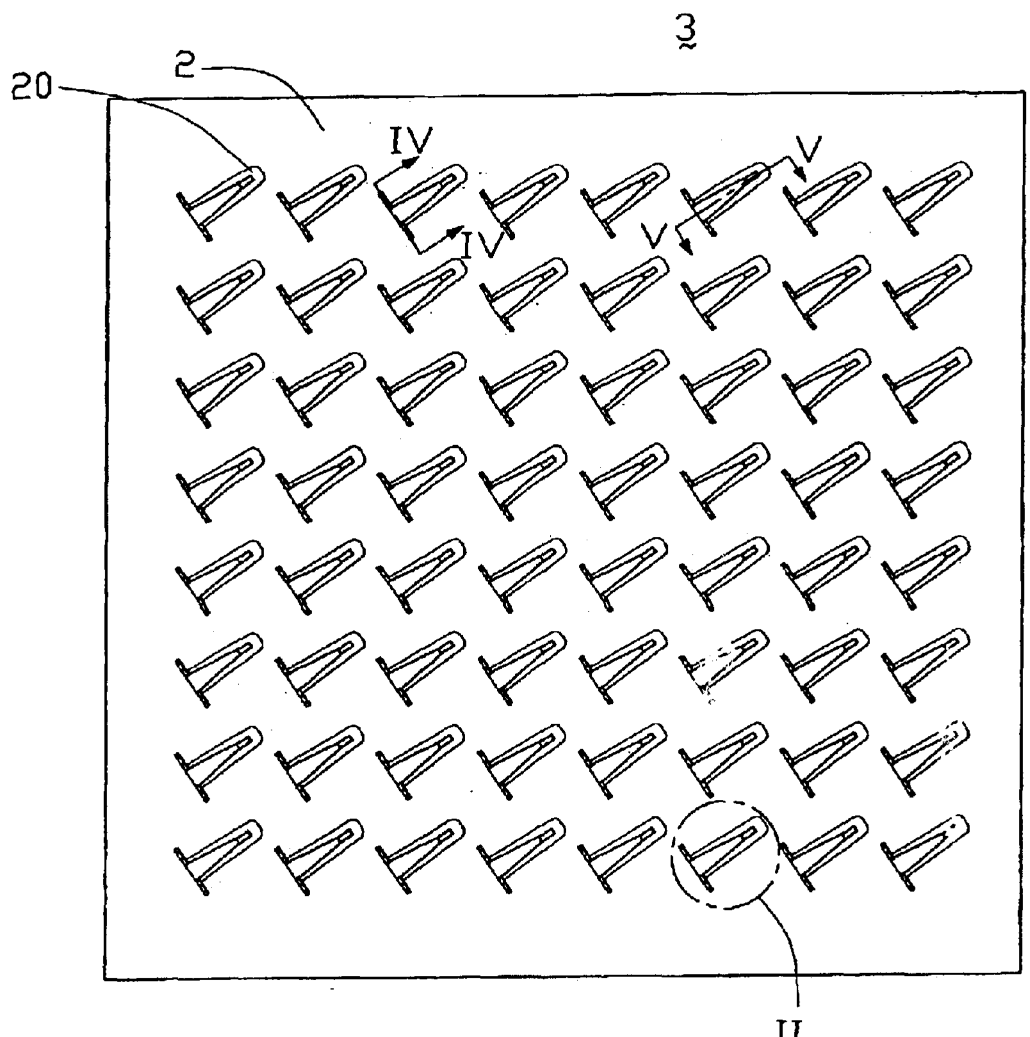
FIG. 1 is a top elevation view of an LGA electrical connector in nce with a preferred embodiment of the present invention.
Figure 6:
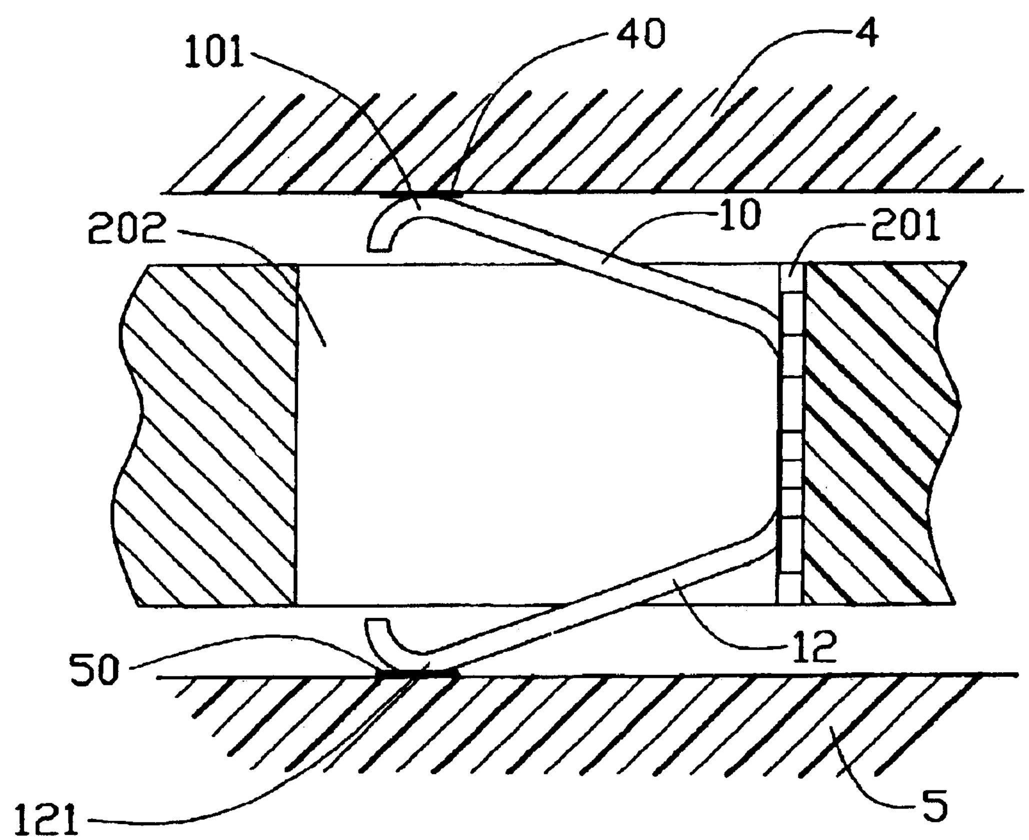
FIG. 6 is similar to FIG. 5, but showing one terminal of the LGA connector engaged between an LGA chip and a PCB.
Figure 7:
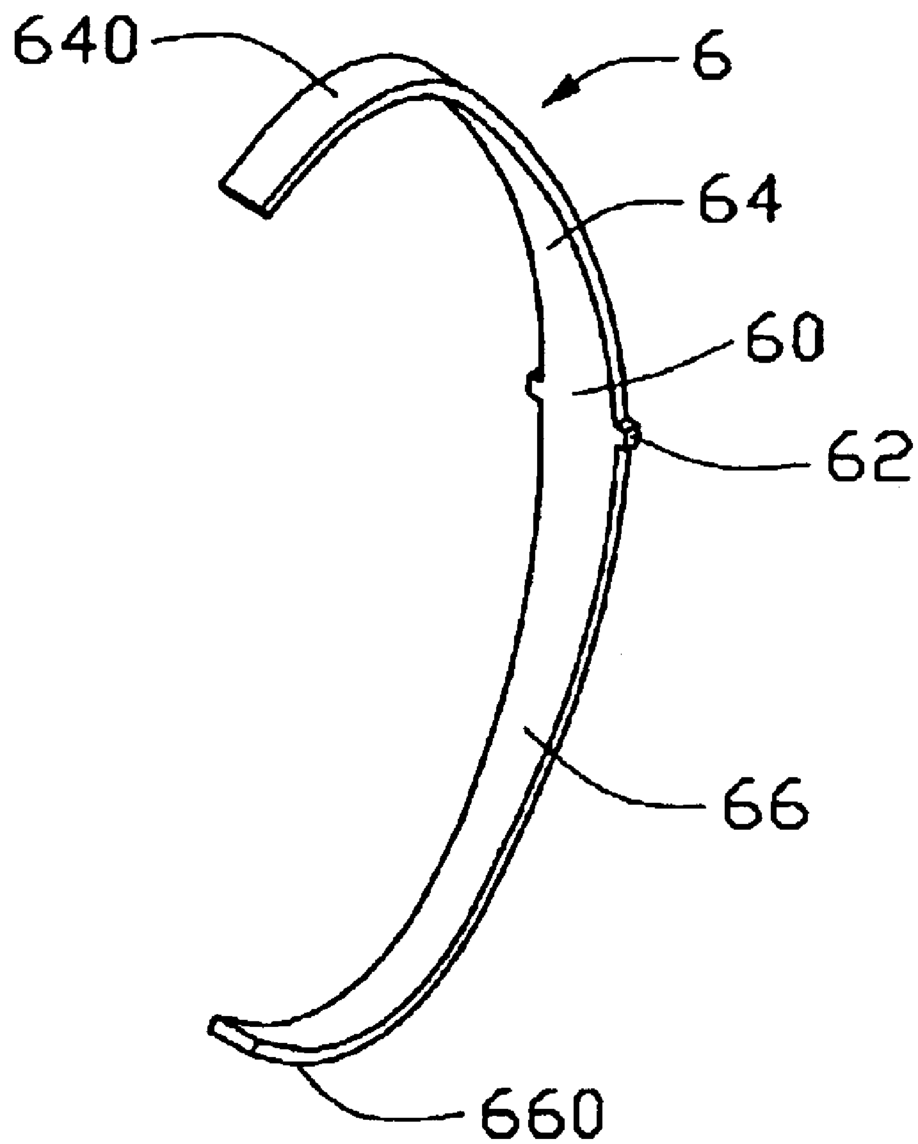
FIG. 7 is an isometric view of a conventional terminal of an connector.

Referring to FIGS. 1 and 6, an LGA electrical connector 3 in accordance with the preferred embodiment of the present invention is adapted for electrically connecting an LGA chip 4 with a PCB 5. The LGA connector 3 comprises an insulative housing 2, and a multiplicity of terminals 1 arranged in a multiplicity of passageways 20 of the housing 2 in a rectangular array.

Figure 3:
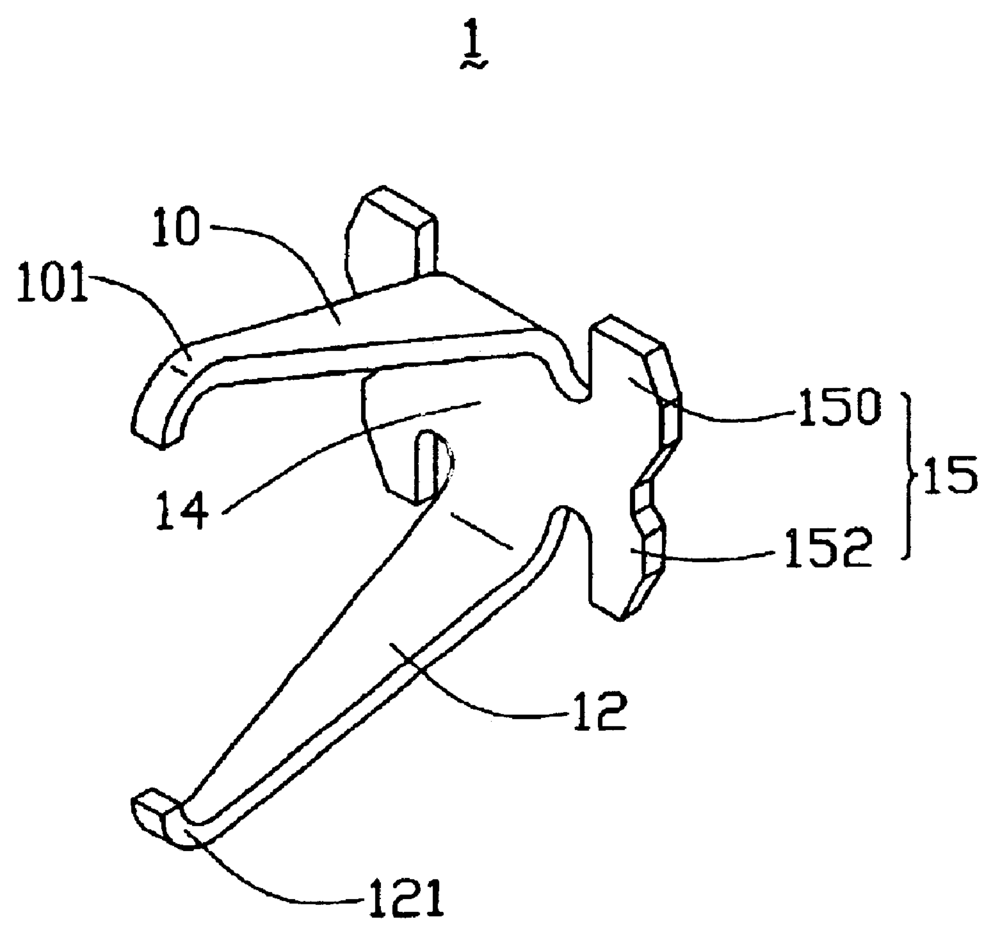
FIG. 3 is an enlarged, isometric view of one terminal of the LGA connector of FIG. 1.

Referring particularly to FIG. 3, each terminal 1 is stamped from a sheet of conductive metallic material, and has a generally C-shaped profile. The terminal 1 comprises a connection portion 14. An upper section and a lower section of the connection portion 14 are bifurcated respectively by a first spring arm 10 and a second spring arm 12. A pair of opposite lateral retention portions 15 is thereby formed on the connection portion 14. The first spring arm 10 is generally convex and tapered, and extends upwardly and forwardly from the upper section of the connection portion 14. The first spring arm 10 has a curved top first contact portion 101 at a free end thereof, for engaging with a corresponding plate-like first contact pad 40 of the LGA chip 4 when the LGA chip 4 is pressed against the LGA connector 3. Thus, the LGA connector 3 is electrically connected with the LGA chip 4. The second spring arm 12 is generally convex and tapered, and extends downwardly and forwardly from the lower section of the connection portion 14. The second spring arm 12 has a curved bottom second contact portion 121 at a free end thereof, for soldering the terminal 1 to a corresponding second contact pad 50 of the PCB 5. Thus, the terminal 1 electrically connects the LGA chip 4 to the PCB 5. Each retention portion 15 itself is bifurcated, and forms a top first interference block 150 and a bottom second interference block 152. The first and second interference blocks 150, 152 are adapted for interferentially fixing the terminal 1 in the corresponding passageway 20 of the housing 2. The first interference block 150 is wider than the second interference block 152 along an axis parallel to a top face of the retention portion 15. A cross-sectional area of a junction of the first interference block 150 and a medial part of the retention portion 15 is relatively large compared with an overall cross-sectional area of the first interference block 150. A cross-sectional area of a junction of the second interference block 152 and the medial part of the retention portion 15 is relatively large compared with an overall cross-sectional area of the second interference block 152. Therefore, structures of the first and second interference blocks 150, 152 are reinforced. This enables interferential forces between the terminal 1 and the housing 2 in the corresponding passageway 20 to be enhanced.

Figure 2:
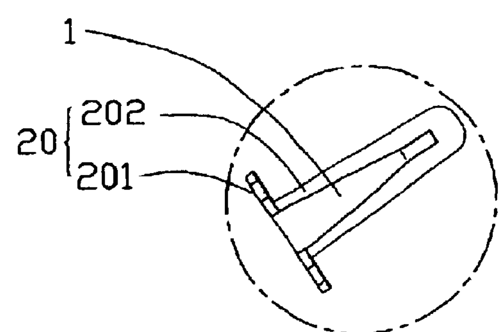
FIG. 2 is an enlarged view of a circle portion II of FIG. 1.
Figure 4:
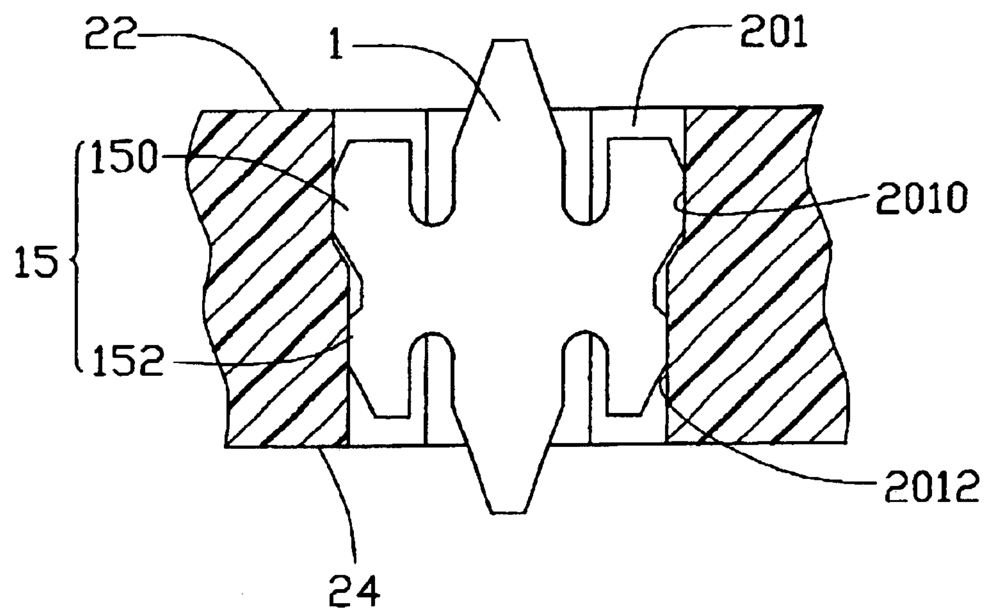
FIG. 4 is a cross-sectional view taken along line IV—IV of FIG. 1.
Figure 5:
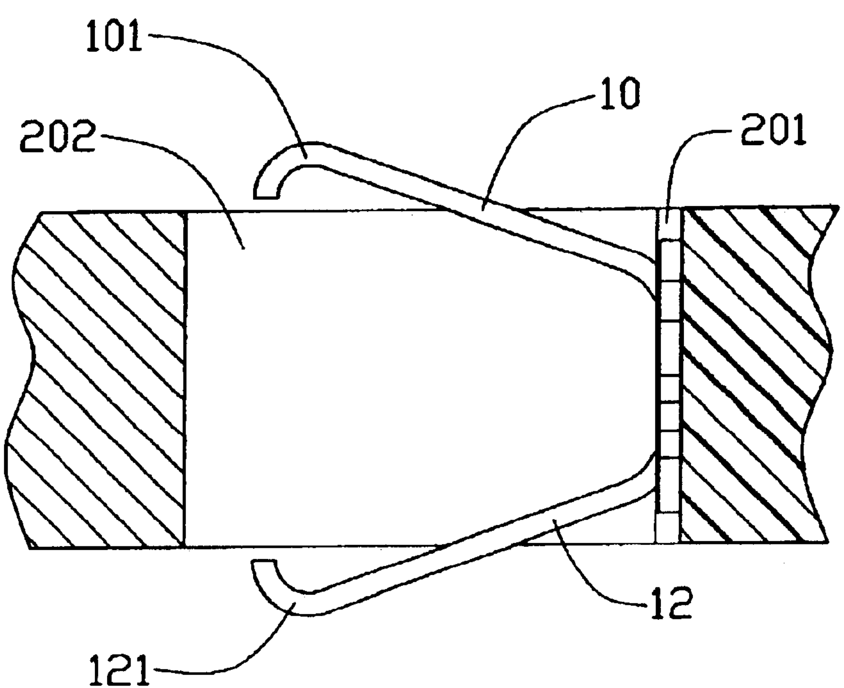
FIG. 5 is a cross-sectional view taken along line V—V of FIG. 1.

Referring also to FIGS. 2, 4 and 5, the housing 2 has a top face 22 and an opposite bottom face 24. Each passageway 20 spans a thickness of the housing 2 between the top face 22 and the bottom face 24, and has a generally T-shaped profile. The passageway 20 comprises a broad receiving hole 202, and a narrow retention space 201 in communication with one end of the receiving hole 202. Each of lateral sidewalls of the passageway 20 at opposite sides of the retention space 201 is stepped, and comprises an upper first sidewall 2010 and a lower second sidewall 2012. Thus a space between the opposite second sidewalls 2012 is less than a space between the opposite first sidewalls 2010.

Referring particularly to FIG. 6, each terminal 1 is received in the corresponding passageway 20 of the housing 2. The receiving hole 202 of the housing 2 receives the first and second spring arms 10, 12 of the terminal 1, and the retention space 201 of the housing 2 interferentially receives the retention portion 15 of the terminal 1. Once the terminal 1 has been completely fastened in the passageway 20 of the housing 2, the first contact portion 101 of the terminal 1 protrudes out from the first face 22 of the housing 2, and the second contact portion 121 of the terminal 1 protrudes out from the second face 24 of the housing 2. The first interference blocks 150 of the terminal 1 interferentially engage with the first sidewalls 2010 of the passageway 20 of the housing 2, and the second interference blocks 152 interferentially engage with the second sidewalls 2012 of the passageway 20. Thus, the terminal 1 is interferentially retained in the passageway 20. Because the space between the second sidewalls 2012 is less than that between the first sidewalls 2010 and the first interference blocks 150 are wider than the second interference blocks 152, the terminal 1 is easily received into the passageway 20. In addition, the terminal 1 can not slide too far down in the passageway 20. Furthermore, because the structures of the first and second interference blocks 150, 152 are reinforced, retention forces between the terminal 1 and the housing 2 are enhanced. Accordingly, the terminal 1 is securely and reliably retained in the passageway 20. Moreover, the terminal 1 resists distortion in assembly and in subsequent use of the LGA connector 3. As a result, signal transmission between the LGA chip and the PCB is stable and reliable, While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electrical package with a circuit substrate, the electrical connector comprising:

an insulative housing defining a plurality of passageways therein, each of the passageways comprising a first passage and a second passage, the first passage being narrower than the second passage and comprising a pair of stepped sidewalls; and a plurality of terminals received in the passageways, each of the terminals comprising a plurality of interference portions;

wherein at least one of the interference portions interferentially engages with the stepped sidewalls of the first passage, facilitating the terminals being securely and stably received in the passageways;

wherein the housing defines opposite sidewalls in the firs passageway, the opposite sidewalls comprising opposite first sidewalls and opposite second sidewalls, and said stepped sidewalls are situated between the opposite first sidewalls and the opposite second sidewalls respectively; wherein the stepped sidewalls of the housing face upwardly;

wherein each of the stepped sidewalls of the housing has a slant surface with respect to a thickness direction of the housing.

2. The electrical connector as described in claim 1, wherein a span between the opposite first sidewalls is wider than that between the opposite second sidewalls.

3. The electrical connector as described in claim 1, wherein said interference portions are divided into upper interference portions engaging the first sidewalls and lower interference portions engaging the second sidewalls.

4. The electrical connector as described in claim 1, wherein said each of the terminals comprises a connection portion being bifurcated by a pair of opposite spring members thereby forming a pair of retention portions each with a first interference portion and a second interference portion.

5. The electrical connector as described in claim 4, wherein the first interference portion of said each of the terminals interferentially engages with the first sidewalls of the first passage, and the second interference portion of said each of the terminals interferentially engages with the second sidewalls of the first passage.

6. The electrical connector as described in claim 4, wherein the spring members each have a contact portion located at an end thereof.

7. The electrical connector as described in claim 6, wherein the spring members of said each of the terminals are received in the second passage, and the retention portions are retained in the first passage of the housing.

8. The electrical connector as described in claim 7, wherein the contact portion of each of the spring members protrudes outside the passageway of the housing.

9. A terminal comprising:

a pair of opposite spring members;

a vertical connection portion interconnecting the spring members;

wherein the connection portion comprises a pair of opposite first interference portions laterally engaging parts of a housing and a pair of opposite second interference portions laterally engaging sections of the housing, a maximal horizontal periphery width between the opposite first interference portions is wider than that between the opposite second interference portion in a horizontal axis parallel to a top face of the connection portion;

wherein the connection portion is bifurcated at an upper section and a bottom section by the opposite spring members to form a pair of retention portions each with the first interference portion and the second interference portion.

10. The terminal as described in claim 9, wherein the spring members each have a contact portion located at an end thereof.

11. The terminal as described in claim 9, wherein the opposite spring members are situated at a side of the connection portion and are symmetrically arranged relative to the connection portion.

12. The terminal as described in claim 11, wherein the first interference portions are situated above the second interference portions in a vertical direction.

13. The electrical connector as described in claim 12, wherein the connection portion and all the first and second interference portions cooperatively have an H-shaped configuration.

* * * * *